(12) United States Patent
Kim et al.

(10) Patent No.: US 8,101,455 B2
(45) Date of Patent: Jan. 24, 2012

(54) METHOD OF FABRICATING SOLAR CELL

(75) Inventors: Tae Youn Kim, Seoul (KR); Weon Seo Park, Gyeonggi-do (KR); Jeong Woo Lee, Gyeonggi-do (KR); Seong Kee Park, Gyeonggi-do (KR); Kyung Jin Shim, Chungbuk (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/641,873

(22) Filed: Dec. 18, 2009

(65) Prior Publication Data
US 2010/0210062 A1 Aug. 19, 2010

(30) Foreign Application Priority Data
Feb. 16, 2009 (KR) .................. 10-2009-0012411

(51) Int. Cl.
*H01L 21/00* (2006.01)
*H01L 29/08* (2006.01)
*H01L 35/24* (2006.01)
*H01L 51/00* (2006.01)

(52) U.S. Cl. ................. 438/88; 438/57; 438/71; 438/82
(58) Field of Classification Search .................. 438/232, 438/186, 205
See application file for complete search history.

(56) References Cited

U.S. PATENT DOCUMENTS 5,977,477 A * 11/1999 Shiozaki ...................... 136/256
7,227,066 B1 * 6/2007 Roscheisen et al. ............ 257/40

* cited by examiner

*Primary Examiner* — Ha Tran T Nguyen
*Assistant Examiner* — Valerie N Brown
(74) *Attorney, Agent, or Firm* — Morgan, Lewis & Bockius LLP

(57) ABSTRACT

A method of fabricating a solar cell is disclosed. The solar cell fabricating method includes forming a first transparent conductive layer on a transparent substrate, texturing an upper surface of the first transparent conductive layer using an etchant solution configured to contain an acid with a molecular weight of about 58~300, forming a photoelectric conversion layer on the first transparent conductive layer, forming a second transparent conductive layer on the photoelectric conversion layer, and forming a rear electrode on the second transparent conductive layer.

20 Claims, 4 Drawing Sheets

METHOD OF FABRICATING SOLAR CELL

CROSS-REFERENCE TO RELATED APPLICATION

The present application claims priority under 35 U.S.C. 119 to Korean Patent Application No. 10-2009-0012411(filed on Feb. 16, 2009), which is hereby incorporated by reference in its entirety.

BACKGROUND

1. Field of the Disclosure

This disclosure relates to a method of fabricating a solar cell.

2. Description of the Related Art

To meet recent increasing energy demands, a variety of solar cells have been developed which convert solar light energy into electric energy. Among the solar cells, solar cells employing a silicon film have been widely used in commerce.

In general, the solar cell generates electron/hole pairs within its semiconductor by external light. Among the electron/hole pairs, the electrons move to an n-type semiconductor and the holes move to a p-type semiconductor, by an electric field generated at a p-n junction. Accordingly, electric power is produced.

The solar cell has been developing to enhance its efficiency of incident light, in order to have superior performance. As such, a variety of structures forcing a greater amount of light to enter into a thin film, which includes a p-n junction and converts solar light into an electric energy, have been proposed.

The structures of a thin film type include a textured structure having an uneven pattern formed on a transparent layer. The solar cells of textured structure have been actively researched in order to realize an improved efficiency of incident light.

BRIEF SUMMARY

Accordingly, the present embodiments are directed to a solar cell fabricating method that substantially obviates one or more of problems due to the limitations and disadvantages of the related art.

An object of the present embodiment is to provide a solar cell with a method fabricating a solar cell with the improved efficiency of incident light.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a method of fabricating a solar cell includes: forming a first transparent conductive layer on a transparent substrate; texturing an upper surface of the first transparent conductive layer using an etchant solution configured to contain an acid with a molecular weight of about 58~300; forming a photoelectric conversion layer on the first transparent conductive layer; forming a second transparent conductive layer on the photoelectric conversion layer; and forming a rear electrode on the second transparent conductive layer.

In the texturing of the first transparent conductive layer, the solar cell fabricating method of the present embodiment forces the upper portion of crystals rather than the side portions between the crystals to be etched, because the etchant solution containing the acid with a molecular weight of about 58~300, i.e., an etchant solution containing an acid with a great molecular weight, is used. As such, the solar cell fabricating method can form the first transparent conductive layer having a rounded uneven pattern. In other words, the solar cell fabricating method allows the first transparent conductive layer to an uneven pattern with a great pitch. Accordingly, it can be provided a solar cell which has an enhanced transmittance in a boundary surface of the first transparent conductive layer.

The etchant solution can contain acetic acid, and the acetic acid can include a hydrogen bonding. As such, the etchant solution can have a characteristic similar to an acid with a molecular weight of about 120. Accordingly, the solar cell fabricating method of the present embodiment, which textures the first transparent conductive layer using the solution containing the acetic acid, can provide a solar cell having an improved transmittance.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
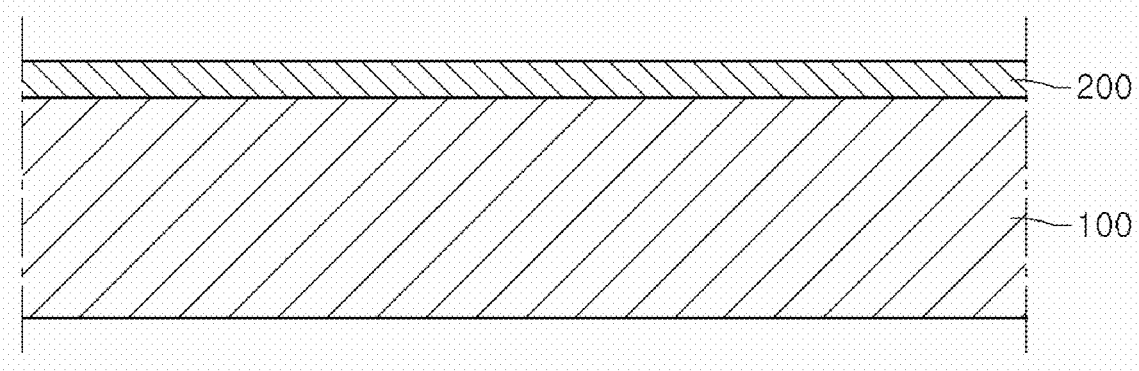
FIGS. 1 to 6 are cross-sectional views illustrating a method, which fabricates a thin-film type solar cell, according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here.

Moreover, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings. In the drawings, the sides of elements can be exaggerated for clarity, but they do not mean the practical sizes of elements.

FIGS. 1 to 6 are cross-sectional views illustrating a method, which fabricates a thin-film type solar cell, according to an embodiment of the present disclosure. Among FIGS. 1 to 6, FIG. 3 is an enlarged cross-sectional view showing a portion A in FIG. 2.

Referring to FIG. 1, a transparent substrate 100 is prepared. The upper surface of the transparent substrate 100 can be textured by an etchant solution or an etchant gas. Alternatively, the upper surface of the transparent substrate can be textured by a variety of processes such as a sand blasting process and others.

The transparent substrate 100 is formed from a transparent insulation material. Actually, the transparent substrate 100 can be any one of a glass substrate, a quartz substrate, and a plastic substrate.

Then, a first transparent conductive layer 200 is formed on the transparent substrate 100. The first transparent conductive layer 200 is prepared by depositing a transparent electric conductive material on the substrate 100. As examples of the transparent electric conductive material, zinc-oxide (ZnO), tin-oxide (SnO), or indium-tin-oxide (ITO) can be used. Moreover, gallium (Ga), aluminum (Al), or Boron (B) can be doped into zinc-oxide (ZnO), and fluorine (F) can be doped into tin-oxide (SnO). As such, it is easy to transport holes (or electric holes) with the first transparent layer 200.

The first transparent conductive layer 200 can be formed through a chemical vapor deposition (CVD) process or a physical vapor deposition (PVD) process which includes a sputtering step. Alternatively, the first transparent conductive layer 200 can be formed by a variety of thin film depositing processes.

Also, the first transparent conductive layer 200 can be formed upon a lower temperature. For example, the first transparent conductive layer 200 can be formed within a temperature range of about 150° C.~180° C. Preferably, the first transparent conductive layer 200 is formed within a temperature range of about 150° C.~160° C.

Moreover, the first transparent conductive layer 200 can have a refractive index of about 1.9~2.0. The thickness of the first transparent conductive layer 200 can become a range of about 4000 Å~6000 Å.

Figure 2:
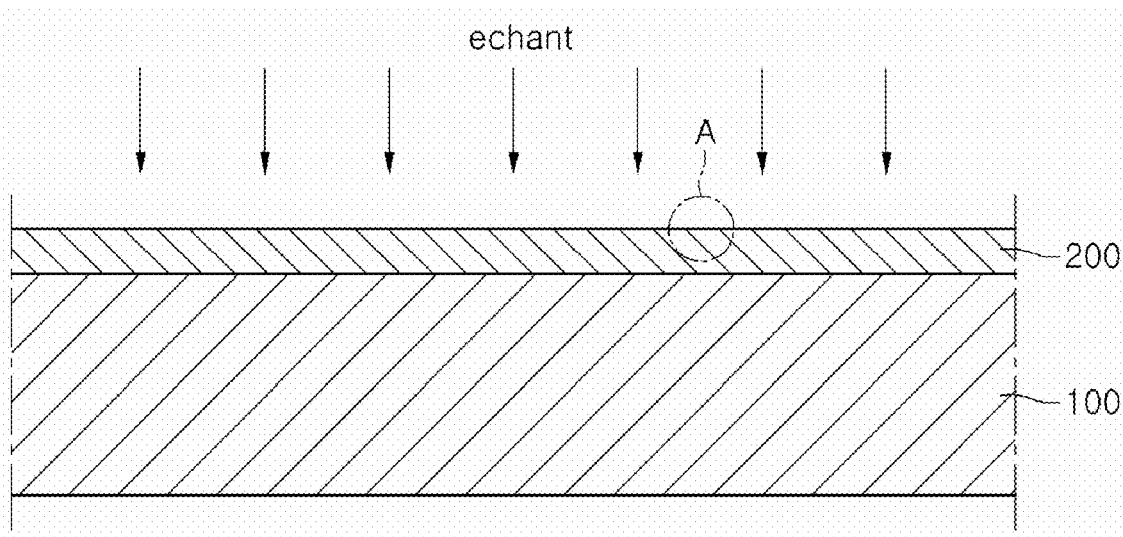

The upper surface of the first transparent conductive layer 200 is textured as shown in FIG. 2. An etchant solution containing an acid with a molecular weight of about 58~300 is used for texturing the first transparent conductive layer 200.

The first transparent conductive layer 200 is textured by being dipped into the acid solution. In this case, the first transparent conductive layer 200 can be dipped into the acid solution during a period of about 5 seconds to one minute. Preferably, the first transparent conductive layer 200 is dipped into the acid solution for a period of about 5~30 seconds.

The acid can include hydrogen bonding. As such, the acid can have a characteristic similar to that of an acid with twice the molecular weight. For example, if an acid with a molecular weight of 60 includes hydrogen bonding, it can have a characteristic similar to that of another acid with a molecular weight of 120.

As an example of the acid, acetic acid can be used. In this case, the etchant solution can contain acetic acid of about 1~4 wt %. Preferably, the etchant solution contains acetic acid by about 3 wt %.

Figure 3:
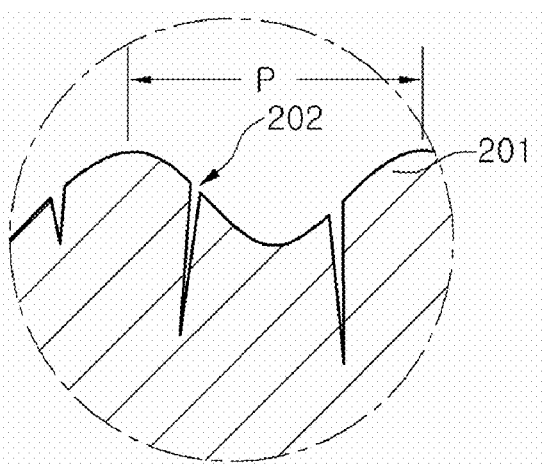

The texturing process forces an uneven pattern 201 to be formed on the upper surface of the first transparent conductive layer 200, as shown in FIG. 3. The uneven pattern 201 is formed to be gently sloped. In other words, the uneven pattern 201 can be formed in a rounded shape. As such, the uneven pattern 201 can be formed to have a lengthened pitch P and a lowered height. For example, the uneven pattern 201 can be formed in a pitch range of about 0.5~1.0 µm and a height of about 0.1~0.3 µm. This smoothly rounded uneven-pattern 201 results from the fact that the upper surface of the first transparent conductive layer 200 is textured by the etchant solution containing the acid with a molecular weight of 58~300.

Figure 4:
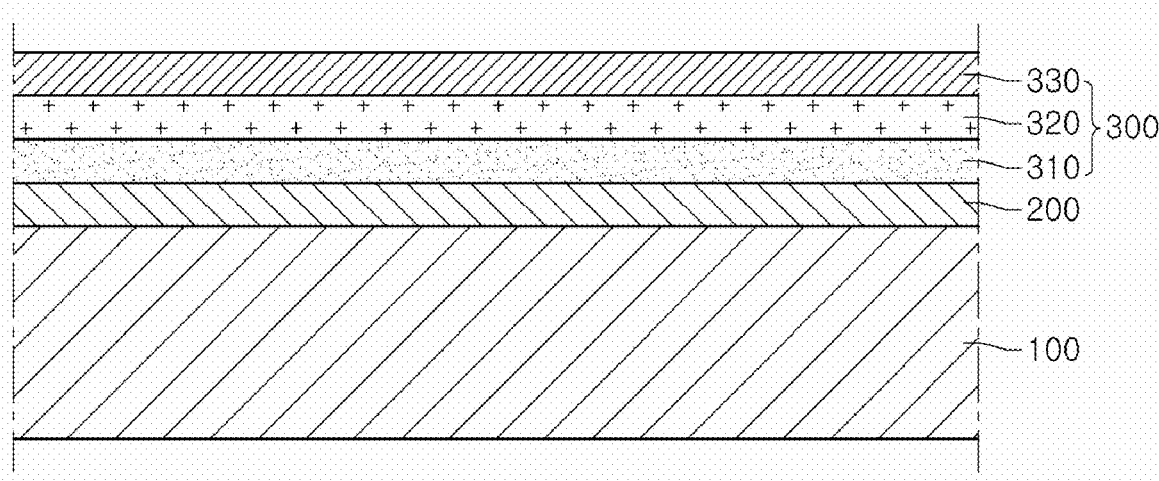

After the texturing process, a photoelectric conversion layer 300 is formed on the first transparent conductive layer 200, as shown in FIG. 4. The photoelectric conversion layer 300 includes a p-type silicon layer 310, an i-type silicon layer 320, and an n-type silicon layer 330 sequentially stacked on the first transparent conductive layer 200.

The p-type silicon layer 310 is formed through a chemical vapor deposition (CVD) process of depositing a p-type impurity and silicon (or impurity-doped silicon) on the first transparent conductive layer 200. Alternatively, silicon carbide can be deposited on the first transparent conductive layer 200, instead of silicon. The p-type silicon layer 310 covers the uneven pattern 201. The p-type impurity can include any one of a third element group consisting of boron (B), gallium (Ga), indium (In), and others. Accordingly, the p-type silicon layer 310 can be formed from amorphous silicon doped with the p-type impurity.

The i-type silicon layer 320 is formed by depositing silicon on the p-type silicon layer 310 using the CVD method. At this time, a conductive impurity is not doped into the i-type silicon layer 320.

The n-type silicon layer 330 covering the i-type silicon layer 320 is formed by depositing an n-type impurity and silicon on the i-type silicon layer 320. The n-type impurity can become any one of a fifth element group consisting of antimony (Sb), arsenic (As), phosphorus (P), and others. Accordingly, the p-type silicon layer 310 can have a structure that the n-type impurity is doped into an amorphous silicon film.

The p-type silicon layer 310 responds to solar light and generates holes (electric holes). The holes generated in the p-type silicon layer 310 are transferred to a first transparent conductive layer 200.

The i-type silicon layer 320 disposed on the p-type silicon layer 310 consists of amorphous silicon which is not doped by any impurity. As such, the i-type silicon layer 320 interposed between the p-type and n-type silicon layers 310 and 330 performs a buffering function.

The n-type silicon layer 330 disposed on the i-type silicon layer 320 is also adjacent to a second transparent conductive layer 400 which will be formed later. The n-type silicon layer 330 responds to solar light and generates electrons. The electrons generated in the n-type silicon layer 330 are transferred to the second transparent conductive layer 400.

Figure 5:
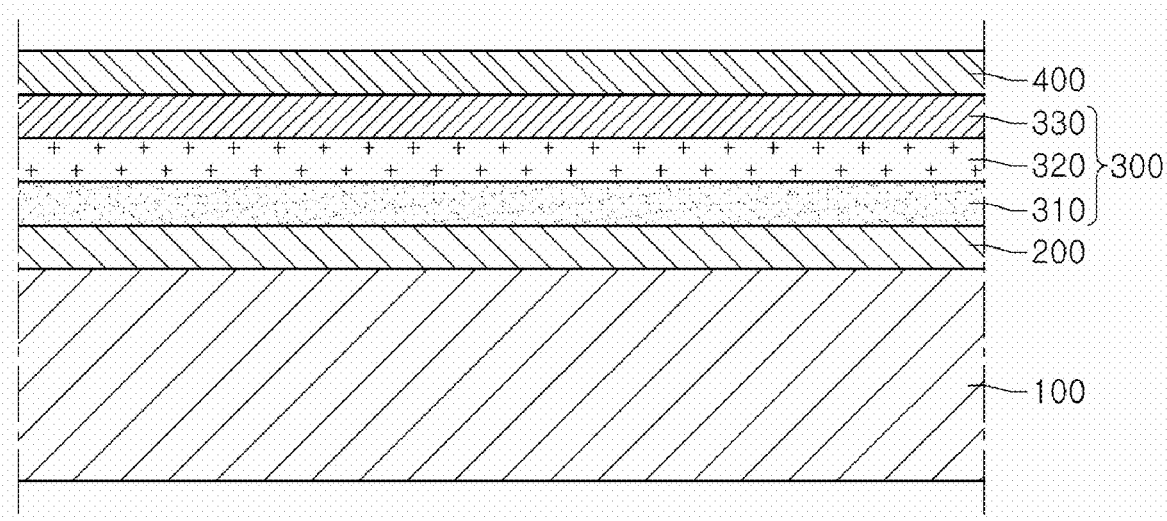

Referring to FIG. 5, the second transparent conductive layer 400 is formed on the photoelectric conversion layer 300. The second transparent conductive layer 400 is prepared by depositing a transparent conductive material on the photoelectric conversion layer 300. The transparent conductive material can become any one of zinc-oxide (ZnO), tin-oxide (SnO), indium-tin-oxide (ITO), and others. Boron can be doped into the second transparent conductive layer 400 consisting of tin-oxide (SnO).

Any one of CVD and PVD processes can be used in the formation of the second transparent conductive layer 400. Also, the second transparent conductive layer 400 can be formed upon a low temperature or a high temperature. For example, the second transparent conductive layer 400 can be formed within a temperature range of about 150° C.~180° C. Preferably, the second transparent conductive layer 400 is formed through any one of the CVD and PVD processes which is performed within a temperature range of about 150° C.~160° C. Alternatively, the second transparent conductive layer 400 can be formed within a temperature range of about 250° C.~300° C.

Moreover, the second transparent conductive layer 400 can have a refractive index of about 1.9~2.0. The second transparent conductive layer 400 disposed on the n-type silicon layer 330 allows it to transfer the electrons easily. As such, the second transparent conductive layer 400 has a considerably higher electron mobility.

Figure 6:
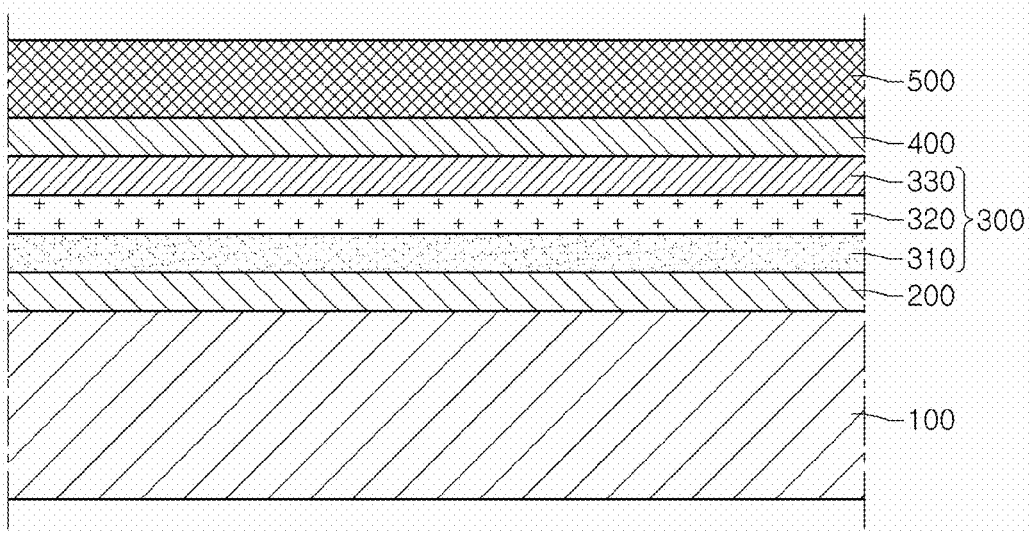

Thereafter, a rear electrode 500 is formed on the second transparent conductive layer 400, as shown in FIG. 6. The rear electrode 500 can be formed through a sputtering process which employs a silver (Ag) target or an aluminum target. Alternatively, the rear electrode 500 can be formed by coating an electrode material paste on the second transparent conductive layer 400 and hardening the coated electrode material paste.

When such a solar cell is exposed to solar light, the solar light is entered to the photoelectric conversion layer 300 via the transparent substrate 100 and the first transparent conductive layer 200. The incident solar light forces pairs of electrons and holes (electric holes) to be generated in the p-type, i-type, and n-type silicon layers 310, 320, and 330. At this time, the electrons of the electron/hole pairs generated in the silicon layers 310, 320, and 330 drift to the rear electrode 500 due to an electric field which is caused by the p-type and n-type silicon layers 310 and 330. The holes of the electron/hole pairs generated in the silicon layers 310, 320, and 330 also drift to the first transparent conductive layer 200 due to the electric field which is derived by the p-type and n-type silicon layers 310 and 330. As such, a difference of electric potential is induced between the first transparent conductive layer 200 and the rear electrode 500. Therefore, the solar cell according to an embodiment of the present disclosure generates an electric energy corresponding to the difference of electric potential.

The solar cell of the present embodiment includes the first transparent conductive layer 200 with the textured upper surface. As such, solar light is effectively entered from the first transparent conductive layer 200 to the photoelectric conversion layer 300. In other words, the reflection of solar light by a boundary surface between the first transparent conductive layer 200 and the photoelectric conversion layer 300 is minimized. Therefore, the solar cell of the present embodiment has an improved electricity generation efficiency.

Also, the solar cell according to an embodiment of the present disclosure allows the upper surface of the first transparent conductive layer 200 to be formed in a gentle uneven pattern 201. Additionally, the first transparent conductive layer 200 can be formed at a low temperature. This results from the fact that the first transparent conductive layer 200 is textured by the etchant solution containing an acid of great molecular weight.

More specifically, when the first transparent conductive layer 200 is formed upon a low temperature range, for example, in a temperature range of 150° C.~180° C., defects and non-uniform crystallization can be caused in the first transparent conductive layer 200. In addition to these, gaps 202 between the crystals which form the first transparent conductive layer 200 can become larger. To this end, the method of the present embodiment performs the process of texturing the first transparent conductive layer 200 using an etchant solution which contains an acid of great molecular weight, such as ascetic acid. In this case, the etchant solution containing the acid of great molecular weight prevents a side etching phenomenon of crystals and the damaging of crystals during the texturing process. As such, the acid does not intrude into the defects and/or the gaps, and the gentle uneven pattern 201 is formed on the first transparent conductive layer 200. Therefore, the first transparent conductive layer 200 has more of the enhanced refractive index so that a larger amount of solar light can enter into the photoelectric conversion layer 300. As a result, the solar cell fabricating method of the present embodiment can provide a solar cell with an improved incident light efficiency and an improved electricity generation efficiency. In addition, the gentle uneven pattern 201 can apply a light trapping effect to the solar cell according to the present embodiment. Furthermore, the first transparent conductive layer 200 formed through a low temperature process is easily textured by the etchant solution containing the acid of great molecular weight, such as acetic acid. In other words, the solar cell fabricating method of the present embodiment can fabricate a solar cell having an improved incident light efficiency, by the low temperature process.

Moreover, the gently textured upper surface of the first transparent conductive layer 200 forces the first transparent conductive layer 200 to have a low resistance. Actually, the first transparent conductive layer 200 has a lower resistance compared to those of other transparent conductive layers which are steeply textured by an etchant solution containing an acid of low molecular weight, such as hydrochloric acid, nitric acid, or others. In other words, the solar cell fabricating method of the present embodiment enables the first transparent conductive layer 200 to be textured by the etchant solution containing the acid of great molecular weight such as acetic acid, thereby reducing the damage of grain boundary and the resistance of the first transparent conductive layer 200. Accordingly, the solar cell fabricating method of the present embodiment can provide a solar cell having an improved electricity generation efficiency, as the resistance of the first transparent conductive layer 200 decreases.

Such a solar cell fabricating method of the present embodiment can be applied to a variety of solar cells. For example, the above solar cell fabricating method can be used in the fabrication of a CIGS(copper indium gallium (di)selenide)-based solar cell, a silicon-based solar cell, a dye-sensitized solar cell (DSSC), a II-VI compound semiconductor solar cell, a III-VI compound semiconductor solar cell, and others.

EXPERIMENT EXAMPLE

A transparent conductive layer #1 is formed by depositing a gallium-doped zinc oxide on a transparent glass substrate in a thickness of about 5000 Å within a temperature of about 180° C. Then, the transparent conductive layer #1 is dipped into a solution containing acetic acid of about 3 wt % for 30 seconds.

COMPARATIVE EXAMPLE

A transparent conductive layer #2 is formed upon the same condition as the experiment example. Thereafter, the transparent conductive layer #2 is dipped into a solution containing nitric acid of about 0.25 wt % for 30 seconds.

Figure 7:
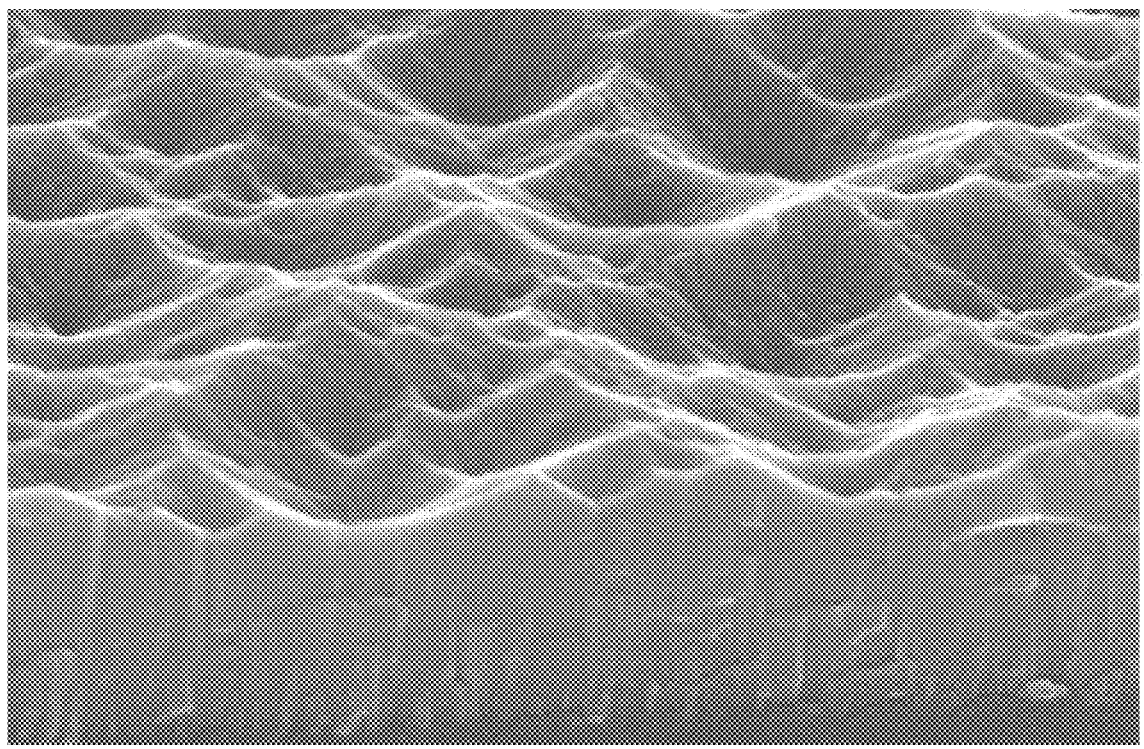
FIG. 7 is a photograph showing a transparent conductive layer which is formed according to an experiment example.
Figure 8:
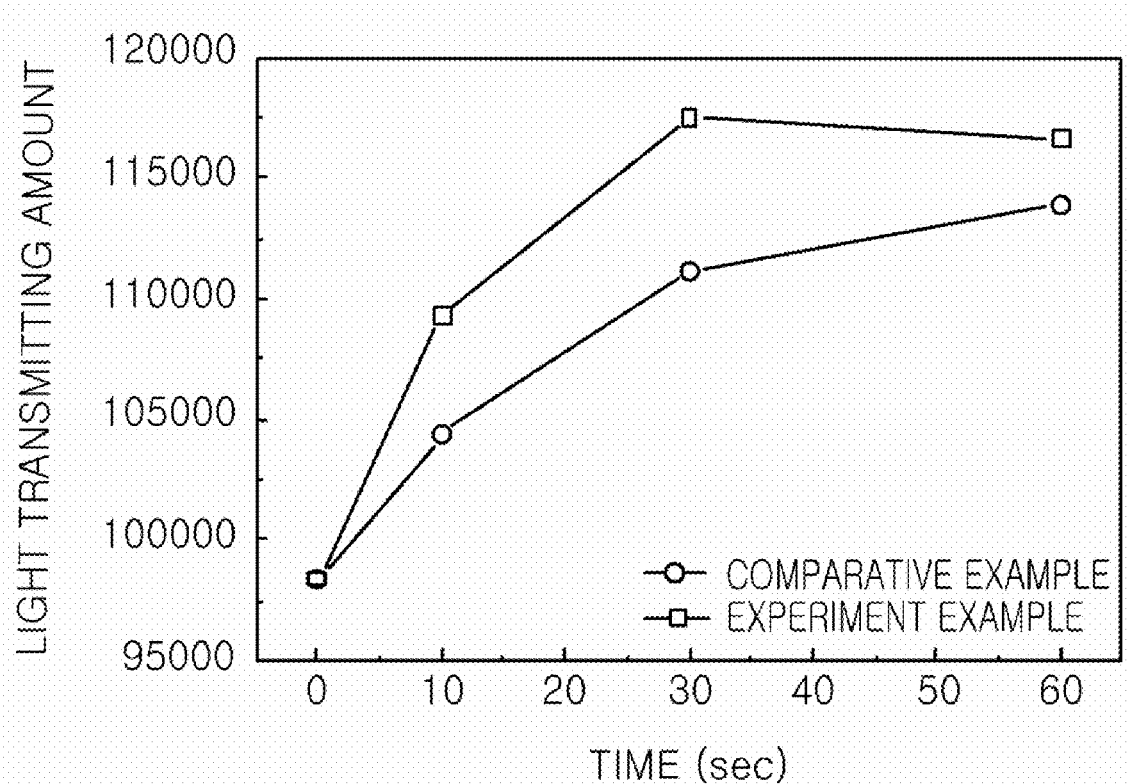
FIG. 8 is a graphic chart illustrating light transmitting quantities of transparent conductive layers, which are formed according to experiment and comparative examples, in accordance with time.
Figure 9:
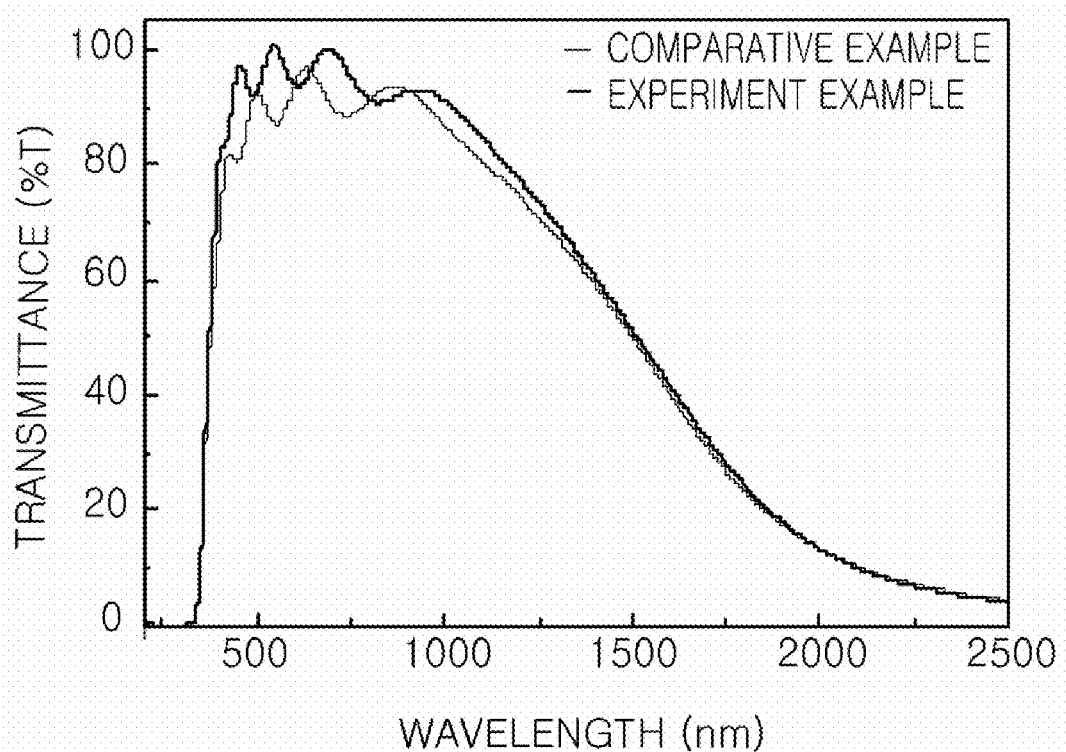
FIG. 9 is a graphic chart illustrating light transmittances of transparent conductive layers, which are formed according to experiment and comparative examples, in accordance with wavelengths.

FIG. 7 is a photograph showing a transparent conductive layer which is formed according to an experiment example. FIG. 8 is a graphic chart illustrating light transmitting quantities of transparent conductive layers, which are formed according to experiment and comparative examples, in accordance with time. FIG. 9 is a graphic chart illustrating light transmittance of transparent conductive layers, which are formed according to experiment and comparative examples, in accordance with wavelengths.

Referring to FIG. 7, it is definitely revealed that the uneven pattern is gently formed by the experiment example. Also, the uneven pattern formed by the experiment example is mostly rounded.

As seen on FIG. 8, it is evident that the transparent conductive layer #1 of the experiment example has a larger transmitting amount of light in comparison with the transparent conductive layer #2 of the comparative example, in whole time. Moreover, the transparent conductive layer #1 has a higher transmittance than that of the transparent conductive layer #1 according to the comparative example, in almost all wavelengths, as shown in FIG. 9. Consequently, it is evident that the experiment example can provide an improved incident light efficiency and an improved electricity generation efficiency compared to the comparative example.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a solar cell, comprising:
depositing zinc oxide on a transparent substrate within a temperature range of about 150° C.~180° C. to form a first transparent conductive layer on the transparent substrate;
texturing an upper surface of the first transparent conductive layer using an etchant solution containing an acetic acid, wherein the amount of the acetic acid in the etchant solution is about 1 wt % to 4 wt %;
forming a photoelectric conversion layer on the first transparent conductive layer;
forming a second transparent conductive layer on the photoelectric conversion layer; and
forming a rear electrode on the second transparent conductive layer,
wherein the first transparent conductive layer has defects and non-uniform crystallization.

2. The method claimed as according to claim 1, wherein the zinc oxide is doped with any one of gallium, aluminum, and boron.

3. The method according to claim 1, wherein the texturing of the upper surface of the transparent conductive layer allows an uneven pattern having a pitch range of about 0.5 μm~1.0 μm and a height of about 0.1 μm~0.3 μm to be formed on the first transparent conductive layer.

4. The method according to claim 1, wherein the depositing of the zinc oxide comprises chemical vapor deposition process or physical vapor deposition process.

5. The method according to claim 1, wherein the depositing of the zinc oxide comprises a sputtering step.

6. The method according to claim 1, wherein the thickness of the first transparent conductive layer is about 4000 Å~6000 Å.

7. The method according to claim 1, wherein the texturing of the upper surface of the first transparent conductive layer comprises dipping the first transparent conductive layer into the etchant solution.

8. The method according to claim 1, wherein the photoelectric conversion layer comprises a p-type silicon layer, an i-type silicon layer, and an n-type silicon layer.

9. The method according to claim 1, wherein the second transparent conductive layer is formed within a temperature range of about 150° C.~180° C.

10. The method according to claim 1, wherein the second transparent conductive layer is formed within a temperature range of about 250° C.~300° C.

11. A method of fabricating a solar cell, comprising:
sputtering zinc oxide within a temperature range of about 150° C.~180° C. on a transparent substrate to form a first transparent conductive layer on the transparent substrate;
texturing an upper surface of the first transparent conductive layer using an etchant solution configured to contain an acetic acid, wherein the amount of the acetic acid contained into the etchant solution is about 1 wt % to 4 wt %;
forming a photoelectric conversion layer on the first transparent conductive layer;
forming a second transparent conductive layer on the photoelectric conversion layer; and
forming a rear electrode on the second transparent conductive layer.

12. The method according to claim 11, wherein the zinc oxide is doped with any one of gallium, aluminum, and boron.

13. The method according to claim 11, wherein the texturing of the upper surface of the transparent conductive layer allows an uneven pattern having a pitch range of about 0.5 μm~1.0 μm and a height of about 0.1 μm~0.3 μm to be formed on the first transparent conductive layer.

14. The method according to claim 11, wherein the depositing of the zinc oxide comprises chemical vapor deposition process or physical vapor deposition process.

15. The method according to claim 11, wherein the depositing of the zinc oxide comprises a sputtering step.

16. The method according to claim 11, wherein the thickness of the first transparent conductive layer is about 4000 Å~6000 Å.

17. The method according to claim 11, wherein the texturing of the upper surface of the first transparent conductive layer comprises dipping the first transparent conductive layer into the etchant solution. conductive layer is formed within a temperature range of about 150° C.~180° C.

18. The method according to claim 11, wherein the photoelectric conversion layer comprises a p-type silicon layer, an i-type silicon layer, and an n-type silicon layer.

19. The method according to claim 11, wherein the second transparent conductive layer is formed within a temperature range of about 150° C.~180° C.

20. The method according to claim 11, wherein the second transparent conductive layer is formed within a temperature range of about 250° C.~300° C.

* * * * *